(12) United States Patent
Sohda et al.

(10) Patent No.: US 9,543,053 B2
(45) Date of Patent: Jan. 10, 2017

(54) ELECTRON BEAM EQUIPMENT

(71) Applicant: Hitachi High-Technologies Corporation, Minato-ku, Tokyo (JP)

(72) Inventors: Yasunari Sohda, Tokyo (JP); Takeyoshi Ohashi, Tokyo (JP); Takafumi Miwa, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/445,056

(22) Filed: Jul. 29, 2014

(65) Prior Publication Data

US 2015/0034836 A1    Feb. 5, 2015

(30) Foreign Application Priority Data

Jul. 31, 2013    (JP) ................................. 2013-158902

(51) Int. Cl.
| | | |
|---|---|---|
| *H01J 37/14* | (2006.01) | |
| *G21K 1/093* | (2006.01) | |
| *H01J 37/28* | (2006.01) | |

(52) U.S. Cl.
CPC .............. *G21K 1/093* (2013.01); *H01J 37/28* (2013.01); *H01J 2237/12* (2013.01); *H01J 2237/14* (2013.01); *H01J 2237/1534* (2013.01)

(58) Field of Classification Search
CPC .......... H01J 29/46; H01J 29/566; H01J 29/70; H01J 37/00; H01J 37/02; H01J 37/04; H01J 37/10; H01J 37/12; H01J 37/14; H01J 37/141; H01J 37/145; H01J 37/26; H01J 37/261; H01J 37/268; H01J 37/28; H01J 2237/1534; H01J 2237/12; H01J 2237/14; G21K 1/093
USPC ....................................... 250/396 R–396 ML
See application file for complete search history.

(56) References Cited

U.S. PATENT DOCUMENTS

| | | | | |
|---|---|---|---|---|
| 4,376,249 A * | 3/1983 | Pfeiffer ............... | H01J 37/3007 | 250/396 ML |
| 5,155,368 A * | 10/1992 | Edwards, Jr. ......... | H01J 37/045 | 250/396 R |
| 6,040,576 A * | 3/2000 | Benner ................... | H01J 37/05 | 250/305 |
| 6,489,621 B1 * | 12/2002 | Frosien ................... | H01J 37/05 | 250/396 R |
| 7,507,956 B2 * | 3/2009 | Frosien ................... | H01J 37/05 | 250/305 |
| 8,274,046 B1 * | 9/2012 | Ren ........................ | H01J 37/05 | 250/305 |

(Continued)

FOREIGN PATENT DOCUMENTS

| | | | |
|---|---|---|---|
| JP | WO2012/050018 A1 | 4/2012 | |
| JP | 2012-243763 A | 12/2012 | |
| WO | WO2012050018 A1 * | 4/2012 | ............ H01J 37/023 |

*Primary Examiner* — David E Smith
(74) *Attorney, Agent, or Firm* — Miles & Stockbridge P.C.

(57) ABSTRACT

To improve the efficiency of generation of chromatic aberrations of an energy filter for reducing energy distribution. Mounted are an energy filter for primary electrons, the energy filter having a beam slit and a pair of a magnetic deflector and an electrostatic deflector that are superimposed with each other. An electron lens is arranged between the beam slit and the pair of the magnetic deflector and the electrostatic deflector.

11 Claims, 8 Drawing Sheets

(56) References Cited

U.S. PATENT DOCUMENTS

| | | | |
|---|---|---|---|
| 8,334,508 B1* | 12/2012 | Mankos | H01J 37/05 250/305 |
| 2004/0119023 A1* | 6/2004 | Nakasuji | B82Y 10/00 250/396 R |
| 2004/0144920 A1* | 7/2004 | Lopez | H01J 37/153 250/305 |
| 2007/0257207 A1* | 11/2007 | Frosien | H01J 37/09 250/492.3 |
| 2012/0318978 A1* | 12/2012 | Ren | H01J 37/05 250/310 |
| 2013/0270435 A1 | 10/2013 | Sohda et al. | |

* cited by examiner

ELECTRON BEAM EQUIPMENT

CLAIM OF PRIORITY

The present application claims priority from Japanese patent application JP 2013-158902 filed on Jul. 31, 2013, the content of which is hereby incorporated by reference into this application.

BACKGROUND

Technical Field

The present invention relates to electron beam equipment that performs inspection and measurement using an electron beam.

Background Art

Electron beam equipment, such as a scanning electron microscope (SEM) that is used for observation, inspection, or measurement of a sample using an electron beam, accelerates electrons emitted from an electron source and focuses the accelerated electrons on the surface of a sample using an electrostatic lens or a magnetic lens, thereby irradiating the sample surface with the electrons. Such electrons are referred to as primary electrons. Upon irradiation of the sample surface with the primary electrons, secondary electrons (i.e., electrons with low energy and electrons with high energy may also be distinctively referred to as secondary electrons and reflective electrons, respectively) are emitted. When such secondary electrons are detected by scanning the sample surface while deflecting an electron beam, it is possible to obtain a fine pattern on the sample or a scan image of a composition distribution. In addition, when electrons absorbed by the sample are detected, it is also possible to form an absorption current image.

One of the basic performances of a scanning electron microscope is the resolution of an electron beam. Various methods have been attempted to be used to improve the resolution of an electron beam. Among them is a technique of reducing the energy distribution of an electron beam using an energy filter. Such a technique can improve the resolution by reducing the energy distribution and thus reducing chromatic aberrations. Among energy filters, a filer called "Wien filter" is known as a scheme that uses an electron beam in a linear manner. A Wien filter is adapted to generate deflection chromatic aberrations by superimposing a magnetic deflector with an electrostatic deflector (also referred to as ExB), and combining the ExB with a slit on the lower stage to selectively pass an electron beam of partial energy. Wien filters have been mainly used to improve the energy resolution of analytical microscopes so far, and have a possibility of, when applied to reduce chromatic aberrations of an electron lens, being able to improve the resolution of an electron beam probe. Conventional Wien filters are formed by arranging a slit at a position immediately below a combination of a magnetic deflector and an electrostatic deflector (i.e., ExB).

RELATED ART DOCUMENTS

Patent Documents

Patent Document 1: JP 2012-243763 A
Patent Document 2: U.S. Pat. No. 7,507,956 B2
Patent Document 3: WO 2012/050018 A1

SUMMARY

However, the conventional art does not take into consideration an increase in axial chromatic aberrations that are generated by the Wien filter (i.e., chromatic aberration coefficient). When axial chromatic aberrations are increased, it would be impossible to finally improve the resolution even if the energy distribution is reduced. Thus, mounting of the Wien filter will serve no purpose.

The present invention provides a Wien filter for efficiently reducing energy distribution while suppressing an increase in axial chromatic aberrations.

As a means of the present invention, it is effective to provide, in electron beam equipment having mounted thereon an energy filter for primary electrons, the energy filter having a beam slit and a pair of a magnetic deflector and an electrostatic deflector that are superimposed with each other, an electron lens between the beam slit and the pair of the magnetic deflector and the electrostatic deflector. It is also effective to provide, in electron beam equipment having mounted thereon an energy filter for primary electrons, the energy filter having a beam slit and two pairs each having a magnetic deflector and an electrostatic deflector that are superimposed with each other, an electron lens between the beam slit and at least one pair of the magnetic deflector and the electrostatic deflector or between the beam slit and each pair of the magnetic deflector and the electrostatic deflector. As the electron lens, a magnetic lens or an accelerating electrostatic lens is preferably used. When a magnetic lens is used as the electron lens, it is effective to set each of the deflection directions of the magnetic deflector and the electrostatic deflector in a direction different from a beam restriction direction of the beam slit, and further in accordance with excitation of the magnetic lens.

When an electron lens is arranged between the beam slit and the pair of the magnetic deflector and the electrostatic deflector, it is important to align an electron beam to allow it to pass through the center of the electron lens. Thus, it is effective to provide a configuration in which at least one of the paired magnetic deflector or electrostatic deflector is a two-stage deflector, and align an electron beam in the electron lens using such deflector. When a Wien filter is used, alignment between an electron beam and the beam slit is also performed. Thus, it is preferable to provide a slit movement mechanism for allowing the beam slit to finely move in a shorter distance than the slit width, and selectively perform alignment of a beam in the electron lens using the two-stage deflector and perform alignment between the beam slit and an electron beam using the slit movement mechanism.

According to the present invention, it is possible to reduce energy distribution while suppressing an increase in axial chromatic aberrations, and thus improve the resolution of an electron beam.

Other problems, configurations, and advantageous effects will become apparent from the following description of embodiments.

DETAILED DESCRIPTION OF THE EMBODIMENT(S)

Hereinafter, embodiments of the present invention will be described with reference to the drawings. Although an example of a scanning electron microscope will be described, the present invention is also applicable to electron beam equipment other than the scanning electron microscope.

Embodiment 1

Figure 1:
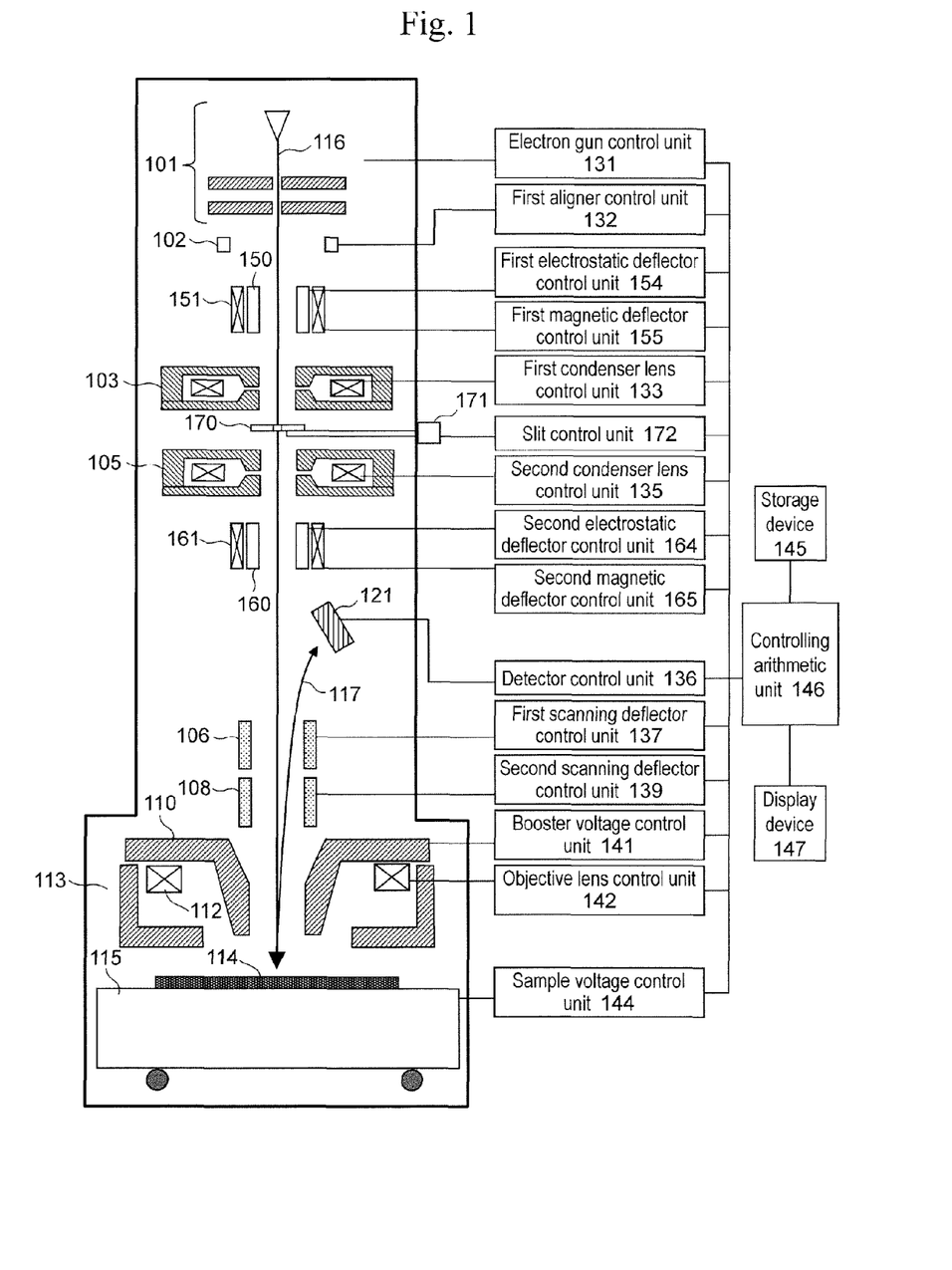
FIG. 1 is an overall schematic view showing a scanning electron microscope in accordance with Embodiment 1.

FIG. 1 is an overall schematic view showing a scanning electron microscope in accordance with Embodiment 1. Primary electrons 116 emitted from an electron gun 101 pass through a pair of a first electrostatic deflector 150 and a first magnetic deflector 151, a first condenser lens 103, a second condenser lens 105, and a pair of a second electrostatic deflector 160 and a second magnetic deflector 161, and are focused on a sample 114 held on a stage 115 by an objective lens 113, thereby irradiating the sample 114. A deflection electric field generated by the first electrostatic deflector 150 and a deflection magnetic field generated by the first magnetic deflector 151 spatially overlap with each other, and thus deflect the primary electrons in opposite directions. Likewise, a deflection electric field generated by the second electrostatic deflector 160 and a deflection magnetic field generated by the second magnetic deflector 161 spatially overlap with each other, and thus deflect the primary electrons in opposite directions. A beam slit 170 is arranged between the first condenser lens 103 and the second condenser lens 105. The position of the beam slit 170 can be adjusted by a slit movement mechanism 171 that is controlled by a slit control unit 172. A negative high voltage is applied to the first electrostatic deflector 150 and the second electrostatic deflector 160 from a first electrostatic deflector control unit 154 and a second electrostatic deflector control unit 164, respectively, to improve the efficiency of generation of deflection chromatic aberrations. Therefore, each of the first electrostatic deflector 150 and the second electrostatic deflector 160 functions as a moderating electrostatic lens. The first magnetic deflector 151 and the second magnetic deflector 161 are controlled by a first magnetic deflector control unit 155 and a second magnetic deflector control unit 165, respectively. A positive voltage is applied to a magnetic path 110 above the objective lens from a booster voltage control unit 141, and a negative voltage is applied to the sample 114 from a sample voltage control unit 144. As the electrostatic lenses are formed herein, the objective lens 113 serves as a magnetic field/electric field-superimposed lens. The aperture of the objective lens 113 faces the sample side, and has a lens structure called "semi in-lens." An objective lens control unit 142 controls an excitation current that flows through an objective lens coil 112.

Secondary electrons 117 emitted from the sample 114 (although low-speed electrons and high-speed electrons may also be distinctively referred to as secondary electrons and reflective electrons, respectively, they are collectively referred to as secondary electrons herein) are detected by a midway detector 121. The detector 121 is controlled by a detector control unit 136. Primary electrons above the sample are two-dimensionally scanned by a first scanning deflector 106 and a second scanning deflector 108, whereby a two-dimensional image of the sample can be obtained. The center position of the two-dimensional image is defined by the first scanning deflector 106 controlled by a first scanning deflector control unit 137 and the second scanning deflector 108 controlled by a second scanning deflector control unit 139. In this embodiment, the first scanning deflector 106 and the second scanning deflector 108 are electrostatic deflectors. The two-dimensional image is displayed on a display device 147. The pair of the first electrostatic deflector 150 and the first magnetic deflector 151 and the pair of the second electrostatic deflector 160 and the second magnetic deflector 161 are each referred to as "ExB" in many cases.

It should be noted that the electron gun 101 is controlled by an electron gun control unit 131; the first condenser lens 103 is controlled by a first condenser lens control unit 133; and the second condenser lens 105 is controlled by a second condenser lens control unit 135. A first aligner 102 for controlling the beam axis of the primary electrons 116 is arranged on the rear stage of the electron gun 101, and is controlled by a first aligner control unit 132. In addition, a controlling arithmetic unit 146 that controls the whole device controls each of the control units uniformly on the basis of control data stored in a storage device 145 and the like. A detection signal detected by the detector 121 is used by being stored in the storage unit 145 or displayed on the display device 147.

Figure 2:
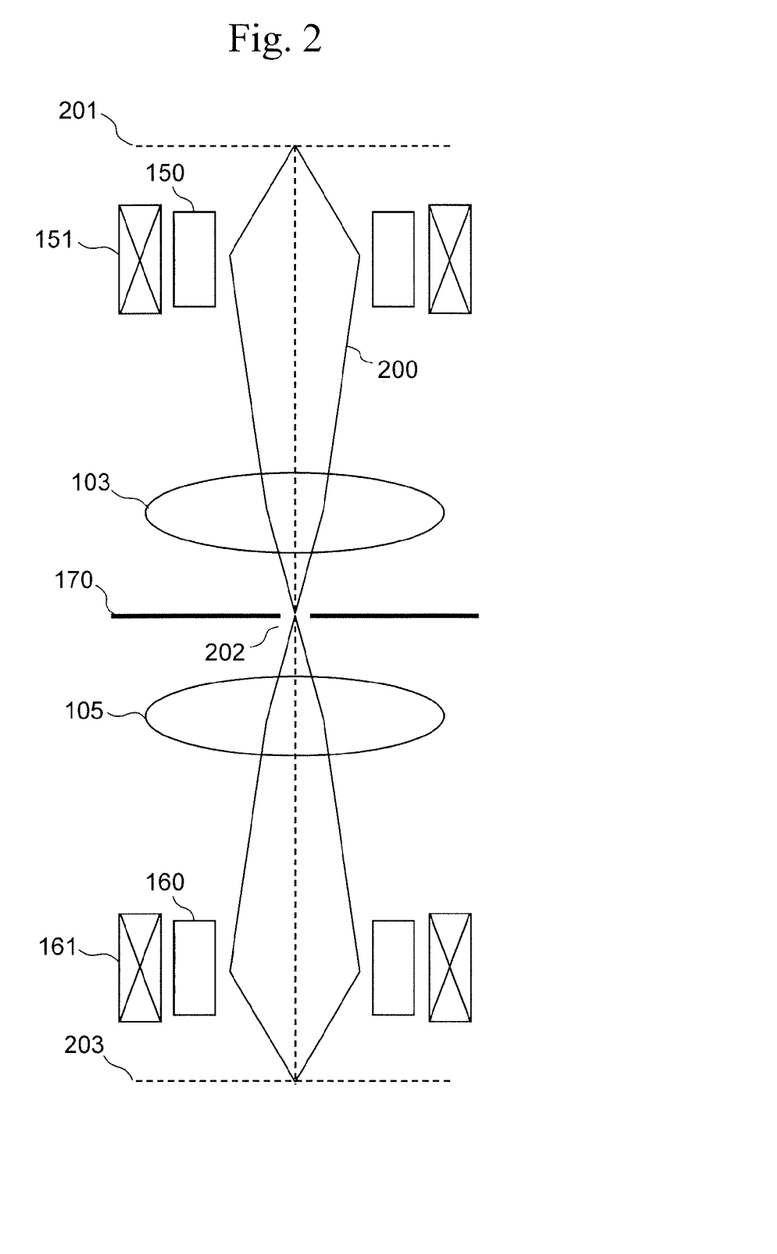
FIG. 2 is a view showing an electron beam trajectory in accordance with Embodiment 1.

FIG. 2 is a view showing a part of an electron beam trajectory 200 in the scanning electron microscope shown in FIG. 1. An object plane 201 is located at a virtual light source of the electron gun 101, an intermediate image plane 202 is located around the beam slit 170, and an image plane 203 is located on the object plane of the objective lens. That is, the first electrostatic deflector 150 and the first condenser lens 103, which is located between the first electrostatic deflector 150 and the beam slit 170, form a single imaging unit. Likewise, the second electrostatic deflector 160 and the second condenser lens 105, which is located between the second electrostatic deflector 160 and the beam slit 170, form a single imaging unit.

Figure 3:
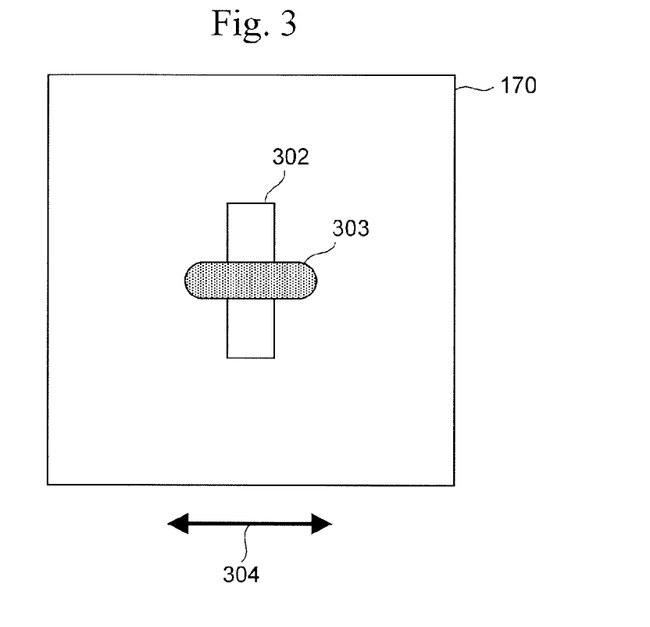
FIG. 3 is a schematic view showing the shape of an electron beam on a beam slit.

FIG. 3 is a schematic view showing the shape of an electron beam on the beam slit. Primary electrons are inversely deflected by the first electrostatic deflector 150 and the first magnetic deflector 151 above the beam slit 170, so that only deflection chromatic aberrations are generated above the beam slit 170. Therefore, an electron beam shape 303 is horizontally long. The direction in which deflection chromatic aberrations are generated above the beam slit 170, which is indicated by the arrow 304 in FIG. 3, is set in the beam restriction direction of the beam slit 170, that is, the short-axis direction of a slit opening 302, and the electron beam is partially extracted by the slit opening 302 so that only electrons with predetermined energy are allowed to pass therethrough, whereby energy distribution can be reduced. What is important about using the Wien filter is improving the efficiency of generation of such deflection chromatic aberrations. In order to improve the generation efficiency, it is necessary to generate deflection chromatic aberrations by minimizing the deflection intensities (i.e., deflection angles) of the deflectors. This is important to suppress degradation of the resolution due to additional aberrations caused by the deflectors, degradation of the stable operation with an increase in voltage and current of the power supplies for the deflectors, and the like.

Applying a negative high voltage as an offset to an electrostatic deflector has an advantageous effect in that it can improve the efficiency of generation of deflection chromatic aberrations. However, when the voltage is increased to improve the generation efficiency, the electrostatic lens effect will increase, which in turn will greatly influence the optics. For example, when a negative voltage is applied to an ExB (200) in the apparatus disclosed in JP 2012-243763 A, the focal length of the ExB lens will become short. This results in the effect of causing the imaging optics for forming an image on the slit (300) to be demagnification optics and the effect of increasing the axial chromatic aberration coefficient. The reason that the chromatic aberration coefficient increases is that a moderating electrostatic lens tends to have a higher chromatic aberration coefficient than an accelerating electrostatic lens. Meanwhile, disadvantages of causing the imaging optics for forming an image on the slit to be demagnification optics are described below. When the optics for forming an image on the slit are caused to be demagnification optics, the angular aperture on the slit will increase. Therefore, axial chromatic aberrations, which increase in proportion to the angular aperture, will also increase. Further, the demagnification rate of the whole electron optics has an upper limit due to the performance of the electron gun. Thus, when the optics for forming an image on the slit are caused to be demagnification optics, the demagnification rates of the optics on the downstream side of the slit will decrease. Consequently, axial chromatic aberrations generated above the slit will have more influence on the resolution on the sample. For the reasons described above and as the chromatic aberration coefficient could increase, there is a limit on the level of a negative voltage that can be applied to the electrostatic deflector.

In contrast, in the present invention, an increase in axial chromatic aberrations is suppressed by using a configuration in which an electron lens is provided between a beam slit and a pair of a magnetic deflector and an electrostatic deflector. Although a magnetic lens is used as the electron lens in this embodiment, an accelerating electrostatic lens may also be used. Advantages of such a configuration are described below.

First, when an electrostatic deflector is arranged on the object plane side to increase a negative voltage applied to the electrostatic deflector, the imaging optics for forming an image on the beam slit will be magnification optics. Thus, the angular aperture on the beam slit will decrease, and axial chromatic aberrations will decrease. Further, the demagnification rate of the whole optics, which is necessary to obtain the best resolution with the amount of current that is necessary on the sample plane, is determined. Thus, when the imaging optics for forming an image on the beam slit are caused to be magnification optics, the demagnification rates of the optics on the downstream side of the beam slit will increase (in the demagnifying direction). Thus, axial chromatic aberrations generated on the beam slit can be reduced on the sample. With such two effects, it is possible to suppress deterioration of the axial resolution due to an increase in the negative voltage applied to the electrostatic deflector. Further, when an electron lens with a low aberration coefficient is used as the electron lens to be inserted, the effect of reducing the axial chromatic aberration coefficient can also be expected. Further, as the present invention can use a configuration in which the distance between the beam slit and the two deflectors is increased, it is possible to increase deflection chromatic aberrations to be generated on the beam slit with the same deflection intensity. As described above, according to the present invention, it is possible to improve the efficiency of generation of deflection chromatic aberrations while suppressing an increase in axial chromatic aberrations.

Figure 4:
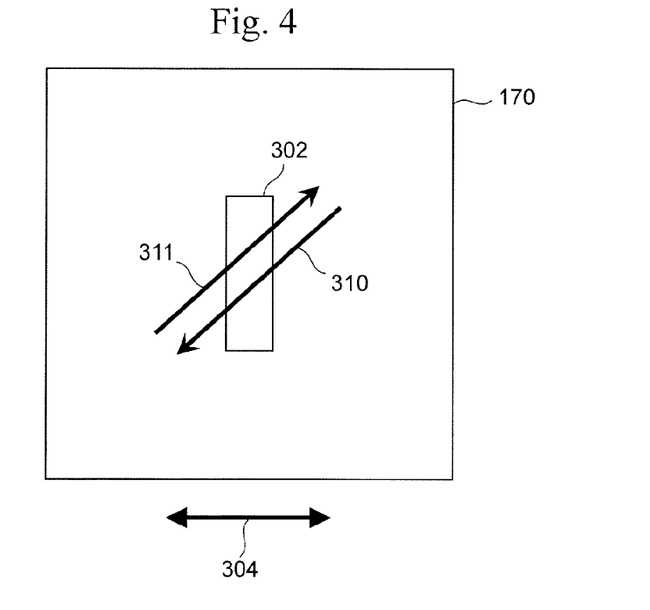
FIG. 4 is a view showing the deflection directions of an electrostatic deflector and a magnetic deflector in a deflector.

A new object to be achieved that newly arises with the configuration of the present invention is the adjustment of the deflection directions of the two deflectors. In this embodiment, a magnetic lens is disposed between two deflectors and a beam slit. Thus, the deflection directions are rotated. Thus, it is preferable to set each of the deflection directions of the magnetic deflector and the electrostatic deflector within the deflector to be a different direction from the beam restriction direction of the beam slit. It will be effective to set the deflection directions in accordance with the excitation of the magnetic lens. In this embodiment, an electron beam is rotated by 45 degrees by the magnetic lens. Thus, as shown in FIG. 4, each of a deflection direction 310 of the electrostatic deflector and a deflection direction 311 of the magnetic deflector within the deflector is also rotated by 45 degrees. Consequently, the direction 304 in which deflection chromatic aberrations are generated on the beam slit 170 coincides with the beam restriction direction of the beam slit (i.e., short-axis direction of the slit opening 302). The rotation angle of the deflection direction can be adjusted by deflecting an electron beam in a direction of maximizing a change of current that passes through the slit along with the deflection. It should be noted that mutual deflection directions of the electrostatic deflector and the magnetic deflector are rotated by 180 degrees.

Next, in this embodiment, a similar optical configuration is arranged on the lower stage of the beam slit 170. This is in order to, by also providing a pair of an electrostatic deflector and a magnetic deflector on the lower stage, cancel out the deflection chromatic aberrations generated on the beam slit 170 and thus avoid the influence on the electron beam shape on the sample. The order of arrangement is opposite to that on the upper stage. Thus, the beam slit 170, the second condenser lens 105, and the pair of the second electrostatic deflector 160 and the second magnetic deflector 161 are sequentially arranged from the upstream side. In the drawing, they are arranged in a configuration that is close to a symmetrical configuration with the beam slit 170 interposed therebetween. However, in the present invention, the configuration need not necessarily be a symmetrical configuration as the efficiency of generation of deflection chromatic aberrations is high and additional aberrations that may occur are small. This is considered to be one of the advantages of the present invention as this allows flexible design of the optics. However, the ExB on the lower stage is not essential when deterioration of the resolution of an electron beam, which occurs due to deflection chromatic aberrations generated by the ExB on the upper stage, is not a big problem on the system, for example, when the main purpose is to perform an analysis or when only the resolution in a single direction is to be determined.

Figure 5:
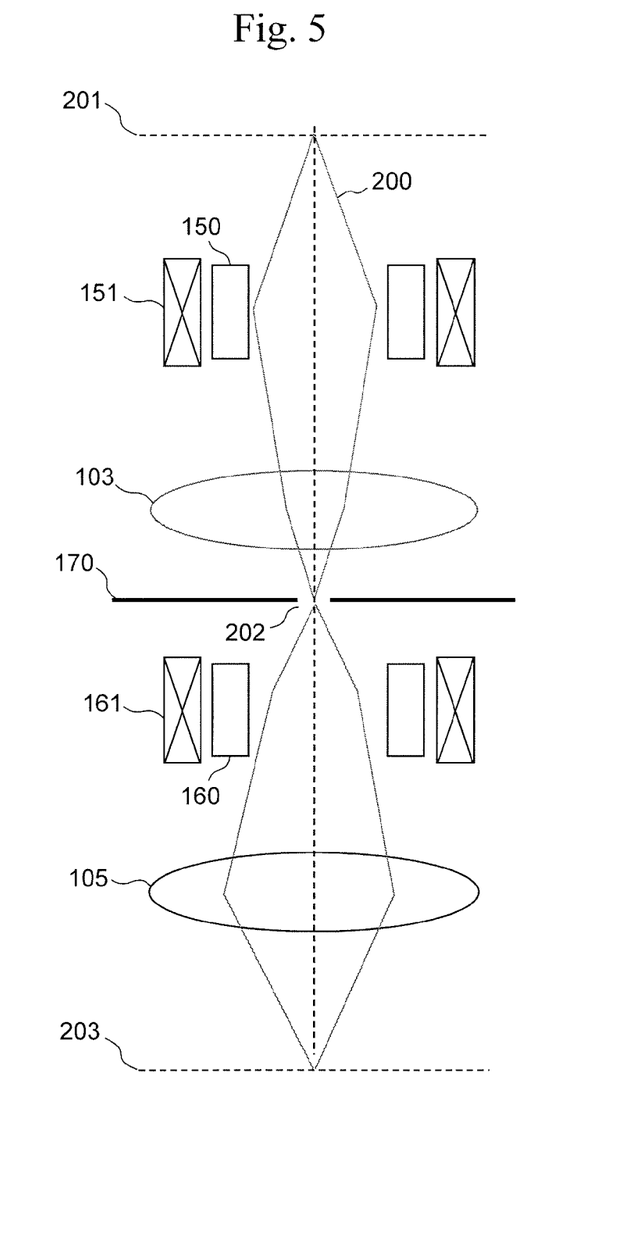
FIG. 5 is a diagram showing another arrangement example of optical elements.
Figure 6:
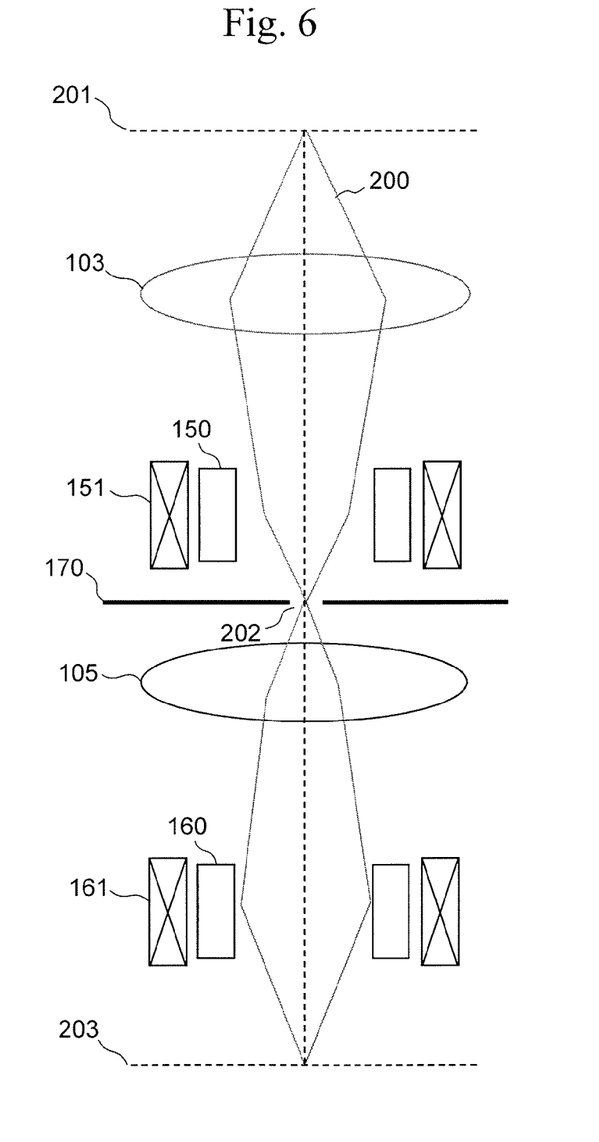
FIG. 6 is a diagram showing another arrangement example of optical elements.

FIGS. 5 and 6 are schematic views each showing another arrangement example of the optical elements. In both FIGS. 5 and 6, an electron lens is arranged between a beam slit and a pair of a magnetic deflector and an electrostatic deflector on a single side. In the example in FIG. 5, as the optics on the upstream side of the beam slit 170, the first condenser lens 103 is arranged between the beam slit 170 and the pair of the first electrostatic deflector 150 and the first magnetic deflector 151. In the example in FIG. 6, as the optics on the downstream side of the beam slit 170, the second condenser lens 105 is arranged between the beam slit 170 and the pair of the second electrostatic deflector 160 and the second magnetic deflector 161. According to such optics, it is possible to, though on a single side, improve the efficiency of generation of deflection chromatic aberrations while suppressing an increase in axial chromatic aberrations, which is the advantageous effect of the present invention.

In the above configuration, when a negative voltage of 1 kV was applied to the electrostatic deflector, it was found to be possible to, for example, reduce the energy distribution of an electron beam by 50% and increase the resolution by 20%, in comparison with a case where a Wien filter was not used.

Embodiment 2

Figure 7:
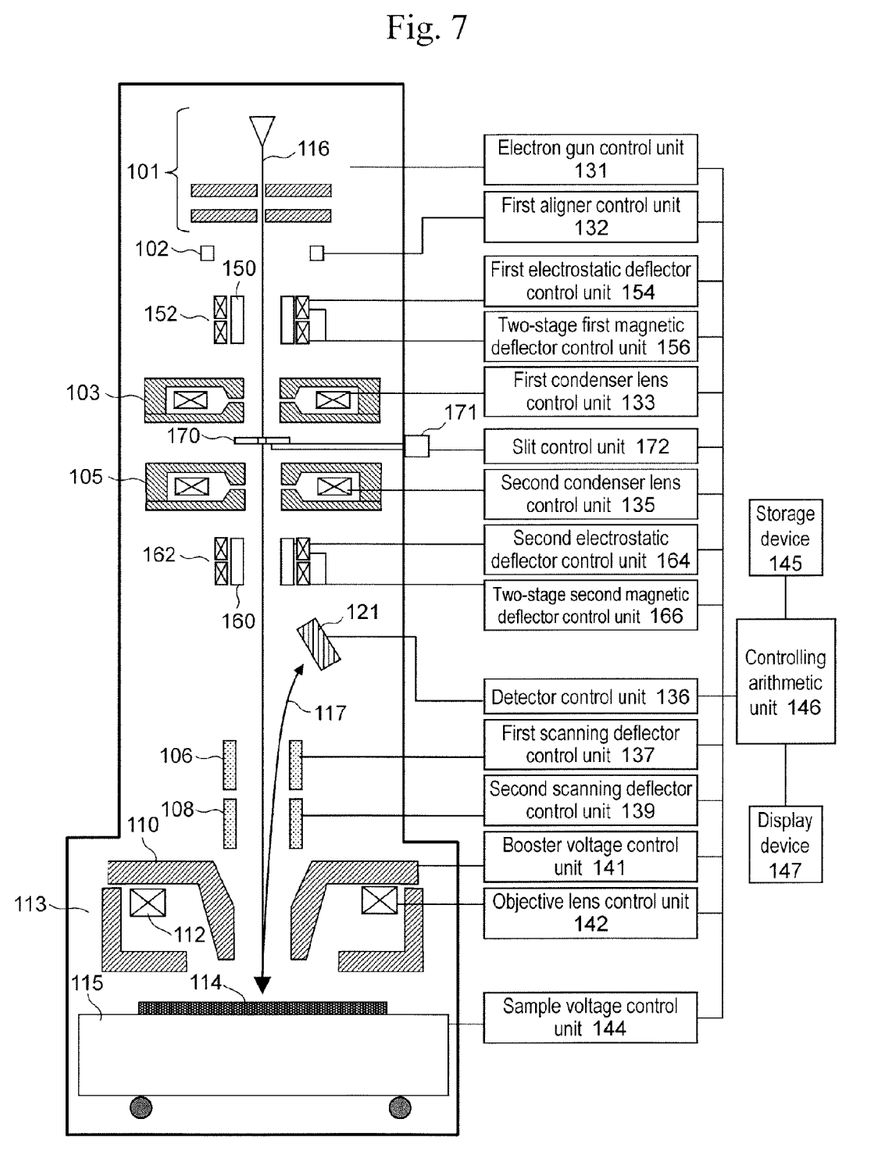
FIG. 7 is an overall schematic view showing a scanning electron microscope in accordance with Embodiment 2.

FIG. 7 is an overall schematic view showing a scanning electron microscope in accordance with Embodiment 2. This embodiment differs from the embodiment shown in FIG. 1 in that the first magnetic deflector 151 and the second magnetic deflector 161 in FIG. 1 are replaced with a two-stage first magnetic deflector 152 and a two-stage magnetic deflector 162, respectively. The two-stage first magnetic deflector 152 is controlled by a two-stage first magnetic deflector control unit 156, and the two-stage second magnetic deflector 162 is controlled by a two-stage second magnetic deflector control unit 166.

Figure 8:
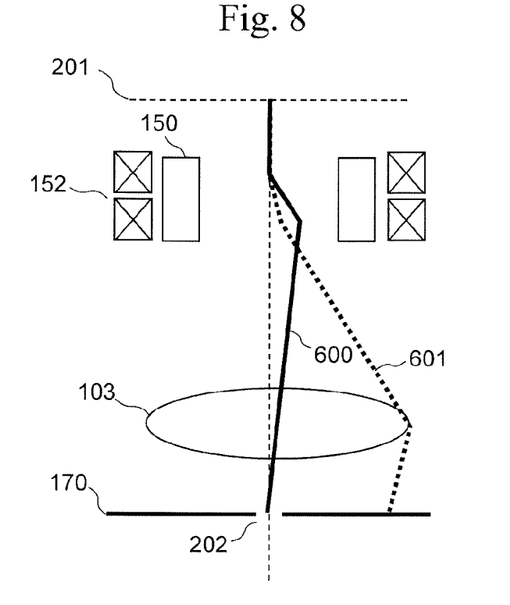
FIG. 8 is a view of an electron beam trajectory in accordance with Embodiment 2.

Another object to be achieved that also arises with the arrangement of a new electron lens is the adjustment of an alignment error between the electron lens and a pair of an electrostatic deflector and a magnetic deflector. When an electron beam emitted from the deflector does not pass through the center of the electron lens, another aberration occurs, which can cause deterioration of the resolution. A two-stage magnetic deflector in this embodiment is a mechanism for avoiding such a problem. In the two-stage magnetic deflector, magnetic deflectors arranged in two stages are independently controllable. FIG. 8 shows an example of the deflection trajectory that can be controlled as a result of providing such a two-stage magnetic deflector. A deflection chromatic aberration generation trajectory 601 is a trajectory to be used as an energy filter, and is controlled so that the center of the electrostatic deflector becomes the center of deflection. Such deflection center control of the two-stage magnetic deflector is also described in WO 2012/050018 A1. In this embodiment, the two-stage magnetic deflector is combined with the arrangement of FIG. 1, whereby an advantageous effect over the related art is found. This corresponds to a lens alignment trajectory 600. When the center of deflection of the two-stage magnetic deflector is set on the beam slit, it becomes possible to, even when the center of the first condenser lens 103 has been displaced, align an electron beam with the center of the lens without having influence on the positional relationship between the electron beam and the slit opening. However, in such a case, the electron beam is tilted above the slit. Thus, angle adjustment may further be needed on the lower stage.

Figure 9:
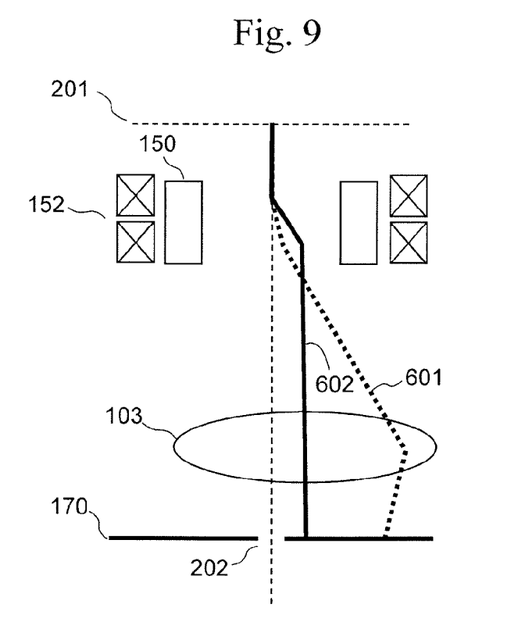
FIG. 9 is a view of an electron beam trajectory in accordance with Embodiment 2.

FIG. 9 shows another example of a lens alignment trajectory 602. In this embodiment, an electron beam is deflected vertically with respect to the lens. With such a trajectory, an electron beam can be aligned even when the first condenser lens 103 is displaced. Further, such a trajectory has an advantage in that vertical incidence on the beam slit 170 is maintained. Meanwhile, although the position of the electron beam above the beam slit 170 is displaced, such a problem can be solved by adjusting the position of the slit opening using the slit movement mechanism 171. The slit movement mechanism 171 is constructed so that it can finely move the slit opening with a precision of a shorter distance than the slit width so as to allow alignment to be performed without moving the electron beam. When alignment performed around the center of the lens and alignment performed on the beam slit are separately controlled as described above, the alignment can be facilitated.

With the above configuration, it was possible to increase the resolution by 25% as an example. It should be noted that a similar advantageous effect can also be obtained when not a two-stage magnetic deflector but a two-stage electrostatic deflector is used.

Embodiment 3

Figure 10:
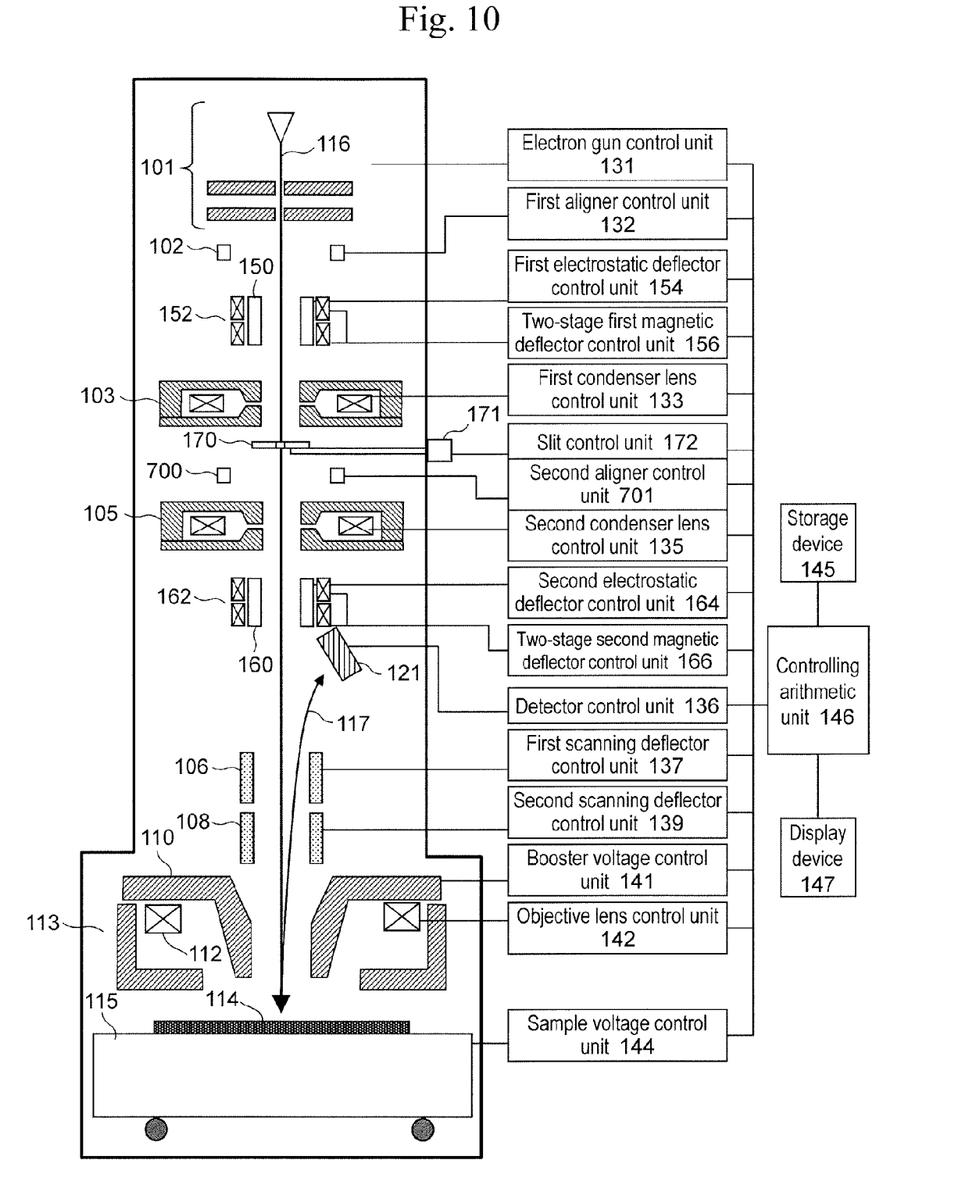
FIG. 10 is an overall schematic view showing a scanning electron microscope in accordance with Embodiment 3.

FIG. 10 is an overall schematic view showing a scanning electron microscope in accordance with Embodiment 3. This embodiment differs from the embodiment shown in FIG. 7 in that in this embodiment, a second aligner 700 is provided below the beam slit. The second aligner 700 is controlled by a second aligner control unit 701.

In the configuration shown in FIG. 10, the second condenser lens 105 on the lower stage is provided above a pair of an electrostatic deflector and a magnetic deflector on the lower stage. Thus, the second aligner 700 is used to align an electron beam with the center of the second condenser lens 105. With such a configuration, it was possible to increase the resolution by 27% as an example.

It should be noted that the present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment.

DESCRIPTION OF SYMBOLS

101 Electron gun
102 First aligner
103 First condenser lens
105 Second condenser lens
106 First scanning deflector
108 Second scanning deflector
113 Objective lens
114 Sample
115 Stage
116 Primary electrons
117 Secondary electrons
121 Detector
145 Storage device
146 Controlling arithmetic unit
147 Display device
150 First electrostatic deflector
151 First magnetic deflector
152 Second-stage first magnetic deflector
154 First electrostatic deflector control unit
160 Second electrostatic deflector
161 Second magnetic deflector
162 Second-stage second magnetic deflector
166 Second-stage second magnetic deflector
170 Beam slit 171 Slit movement mechanism
200 Electron beam trajectory
201 Object plane
202 Intermediate image plane
203 Image plane
302 Slit opening
600 Lens alignment trajectory
601 Deflection chromatic aberration generation trajectory
602 Lens alignment mechanism
700 Second aligner

What is claimed is:

1. An electron beam equipment comprising:
an electron gun configured to emit primary electrons;
an energy filter configured to pass electrons with predetermined energy;
a stage configured to hold a sample; and
an objective lens configured to irradiate the sample held on the stage with the primary electrons that have passed through the energy filter,
wherein the energy filter includes a beam slit and a pair of a magnetic deflector and an electrostatic deflector that are superimposed with each other,
wherein an electron lens is provided between the beam slit and the pair of the magnetic deflector and the electrostatic deflector, the electron lens being a round lens configured to converge primary electron beams onto the beam slit and to form an image of a virtual light source of the electron gun on the beam slit, and being arranged such that application of a voltage of negative 1 kV to each said electrostatic deflector causes a 50% reduction in an energy distribution of said primary electron beams, and
wherein the pair of the magnetic deflector and the electrostatic deflector are configured for decelerating or moderating electrons.

2. The electron beam equipment according to claim 1, wherein
the energy filter includes two pairs of magnetic and electrostatic deflectors, each pair having a magnetic deflector and an electrostatic deflector superimposed with each other, the two pairs being arranged with the beam slit interposed therebetween, and
an electron lens provided between the beam slit and at least one pair of the magnetic deflector and the electrostatic deflector.

3. The electron beam equipment according to claim 1, wherein
the energy filter includes two pairs of magnetic and electrostatic deflectors, each pair having a magnetic deflector and an electrostatic deflector superimposed with each other, the two pairs being arranged with the beam slit interposed therebetween, and
electron lenses respectively provided between the beam slit and the two pairs of magnetic and electrostatic deflectors.

4. The electron beam equipment according to claim 1, wherein the electron lens is one of a magnetic lens or an accelerating electrostatic lens.

5. The electron beam equipment according to claim 1, wherein
the electron lens is a magnetic lens, and
each of the deflection directions of the magnetic deflector and the electrostatic deflector is set in a direction different from a beam restriction direction of the beam slit.

6. The electron beam equipment according to claim 5, wherein the deflection direction of the magnetic deflector and the deflection direction of the electrostatic deflector is set based on an excitation of the magnetic lens.

7. The electron beam equipment according to claim 1, wherein at least one of the paired magnetic deflector or electrostatic deflector is a two-stage deflector.

8. The electron beam equipment according to claim 7, wherein alignment of a beam in the electron lens is performed using the two-stage deflector.

9. The electron beam equipment according to claim 1, further comprising a slit movement mechanism that allows the beam slit to finely move in a shorter distance than a slit width.

10. The electron beam equipment according to claim 9, wherein
at least one of the paired magnetic deflector or electrostatic deflector is a two-stage deflector, and
alignment of a beam in the electron lens is performed by the two-stage deflector, and alignment between the beam slit and the primary electrons is performed by the slit movement mechanism.

11. The electron beam equipment according to claim 3, further comprising a deflector between the beam slit and the electron lens on a lower stage.

* * * * *